US010366817B2

(12) United States Patent
Kim et al.

(10) Patent No.: US 10,366,817 B2
(45) Date of Patent: Jul. 30, 2019

(54) APPARATUS AND METHOD FOR PASSIVE COOLING OF ELECTRONIC DEVICES

(71) Applicant: General Electric Company, Schenectady, NY (US)

(72) Inventors: Joo Han Kim, Niskayuna, NY (US); Nicholas Ernest Williams, Palm Beach Gardens, FL (US); Ning Liu, Rexford, NY (US); Predrag Hadzibabic, Dix Hills, NY (US); Lawrence Joseph Hannaford, Sayville, NY (US)

(73) Assignee: General Electric Company, Schenectady, NY (US)

( * ) Notice: Subject to any disclaimer, the term of this patent is extended or adjusted under 35 U.S.C. 154(b) by 14 days.

(21) Appl. No.: 15/584,755

(22) Filed: May 2, 2017

(65) Prior Publication Data
US 2018/0322995 A1    Nov. 8, 2018

(51) Int. Cl.
| | | |
|---|---|---|
| *H01F 27/10* | (2006.01) | |
| *H01F 27/18* | (2006.01) | |
| *H01F 27/20* | (2006.01) | |
| *H01F 27/00* | (2006.01) | |
| *H05K 7/20* | (2006.01) | |
| *F28D 15/02* | (2006.01) | |
| *F28D 15/04* | (2006.01) | |

(52) U.S. Cl.
CPC ........ *H01F 27/18* (2013.01); *F28D 15/0241* (2013.01); *F28D 15/043* (2013.01); *H01F 27/008* (2013.01); *H01F 27/10* (2013.01); *H01F 27/20* (2013.01); *H05K 7/20336* (2013.01); *H05K 7/20936* (2013.01)

(58) Field of Classification Search
CPC ........ H01F 27/18; H01F 27/008; H01F 27/10; H01F 27/20; H01F 27/105; H01F 27/12; H01F 27/16; H01F 27/2847; H01F 27/2866; H01F 27/322; H01F 27/323; H01F 27/324; H28D 15/02; F05K 7/20
USPC ......... 336/57, 212, 221, 170, 208, 198, 206; 29/602.1, 605, 606
See application file for complete search history.

(56) References Cited

U.S. PATENT DOCUMENTS

| | | |
|---|---|---|
| 4,009,417 A | 2/1977 | Waldon |
| 4,456,899 A | 6/1984 | Matthes |
| (Continued) | | |

FOREIGN PATENT DOCUMENTS

JP    61-193408 A  *  8/1986

OTHER PUBLICATIONS

Niu et al. "Preliminary study of a relay transmitted cooling system with heat pipes and LHP system in large capacity gas insulated transformers", 17th International Conference on Electrical Machines and Systems (ICEMS), 2014, pp. 2332-2335, Hangzhou.

*Primary Examiner* — Mang Tin Bik Lian
(74) *Attorney, Agent, or Firm* — Armstrong Teasdale LLP (57) ABSTRACT

Methods and apparatuses for cooling an electronic device assembly having a heat producing are described. An electronic device assembly includes a heat dissipation member and a dielectric two-phase heat transfer device. The dielectric heat transfer device has an evaporator region thermally attached to a hot region of the heat producing component and a condenser region thermally attached to the heat dissipation member. The dielectric two-phase heat transfer device is fabricated from a dielectric material.

12 Claims, 7 Drawing Sheets

(56) References Cited

U.S. PATENT DOCUMENTS

| | | | | |
|---|---|---|---|---|
| 5,097,241 A | * | 3/1992 | Smith | H01F 27/10 |
| | | | | 165/168 |
| 6,157,282 A | | 12/2000 | Hopkinson | |
| 6,909,349 B1 | | 6/2005 | Longardner et al. | |
| 7,129,808 B2 | | 10/2006 | Roebke et al. | |
| 8,284,004 B2 | | 10/2012 | Tegart | |
| 8,742,876 B2 | | 6/2014 | Chartouni et al. | |
| 9,230,726 B1 | | 1/2016 | Parker et al. | |
| 2008/0204179 A1 | * | 8/2008 | Schuster | F28F 3/12 |
| | | | | 336/57 |
| 2012/0268227 A1 | * | 10/2012 | Howes | H01F 27/18 |
| | | | | 336/57 |

* cited by examiner

APPARATUS AND METHOD FOR PASSIVE COOLING OF ELECTRONIC DEVICES

BACKGROUND

The present application relates generally to electronic devices and, more particularly, to electronic device assemblies with passive heat transfer assemblies.

Some electronic device assemblies, and in particular, transformer assemblies are common electrical components used in electrical and electronic systems and provide such functions in those systems as galvanic isolation, step-down or step-up voltage or current conversion, and power conversion, among others. In addition to the use of transformer assemblies in the power loops of these systems, transformer assemblies are often used as current sensors in control applications.

At least some conventional transformer assemblies generate heat when the input voltage is transformed into a desired output voltage. Additionally, as the design of transformer assemblies becomes more compact to fit into smaller electronic components, the heat generated by the transformer assemblies is concentrated into a smaller space, which may affect other components of the system proximate to the transformer assemblies. In addition, the heat may impact the performance and efficiency of the transformer assemblies and/or the electrical systems. In some instances, the heat generated by the transformer assemblies can cause the transformer assemblies and/or the electrical systems to fail.

To increase the performance and reliability of the transformer assemblies, efficient and reliable cooling of the transformer assemblies' components is desirable. At least some known transformer assemblies utilize active cooling systems which use a cooling fluid, for example, as a cooling medium. At least some active cooling systems, however, include multiple components that can fail, which can decrease the reliability of active cooling systems, causing them to fail more easily. In addition, active cooling systems may not operate autonomously. In addition, at least some known transformer assemblies utilize physical heat sinks and/or heat pipes coupled to a heat sink. Some transformer assemblies also include the use of fans and/or transverse air blowers to channel a flow of air across the heat sinks. The performance of at least some fans and heat sinks can be limited by the operating temperature on the transformer assemblies. In addition, some known heat pipes and/or heat sinks are fabricated from metallic materials. Such heat pipes and/or heat sinks configured to surround the transformer assemblies may become an additional winding in the transformer assemblies and have an induced voltage and potentially current. In addition, such transformer assemblies can have losses in any magnetic material due to eddy currents.

BRIEF DESCRIPTION

In one aspect, an electronic device assembly is provided. The electronic device assembly includes a heat dissipation member and a dielectric two-phase heat transfer device. The heat transfer device includes an evaporator region coupled in thermal communication with a hot region of a heat producing component and a condenser region coupled in thermal communication with the heat dissipation member. The dielectric two-phase heat transfer device is fabricated from a dielectric material.

In another aspect, a dielectric heat transfer bobbin for supporting concentric windings is provided. The heat transfer bobbin includes a base portion and a heat transfer wall coupled to the base portion. The heat transfer wall includes a heat transfer circuit having a thermal channel, an evaporator region, and a condenser region. The thermal channel extends from the evaporator region to the condenser region. The dielectric heat transfer bobbin is fabricated from a dielectric material.

In yet another aspect, a method of cooling an electronic device assembly is provided. The electronic device assembly includes a heat producing component having a hot region. The method includes forming a flexible dielectric two-phase heat transfer device from a dielectric material. The flexible dielectric heat transfer device includes an evaporator region and a condenser region. The method also includes thermally coupling the evaporator region to the hot region of the heat producing component, and thermally coupling the condenser region to a heat dissipation member.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

Approximating language, as used herein throughout the specification and claims, is applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations are combined and interchanged; such ranges are identified and include all the sub-ranges contained therein unless context or language indicates otherwise.

In the following description and claims, the term "coupled" along with its derivatives, may be used. It should be understood that the term "coupled" is used to indicate that two or more elements, which may or may not be in direct physical or electrical contact with each other, cooperate or interact with each other.

Figure 1:
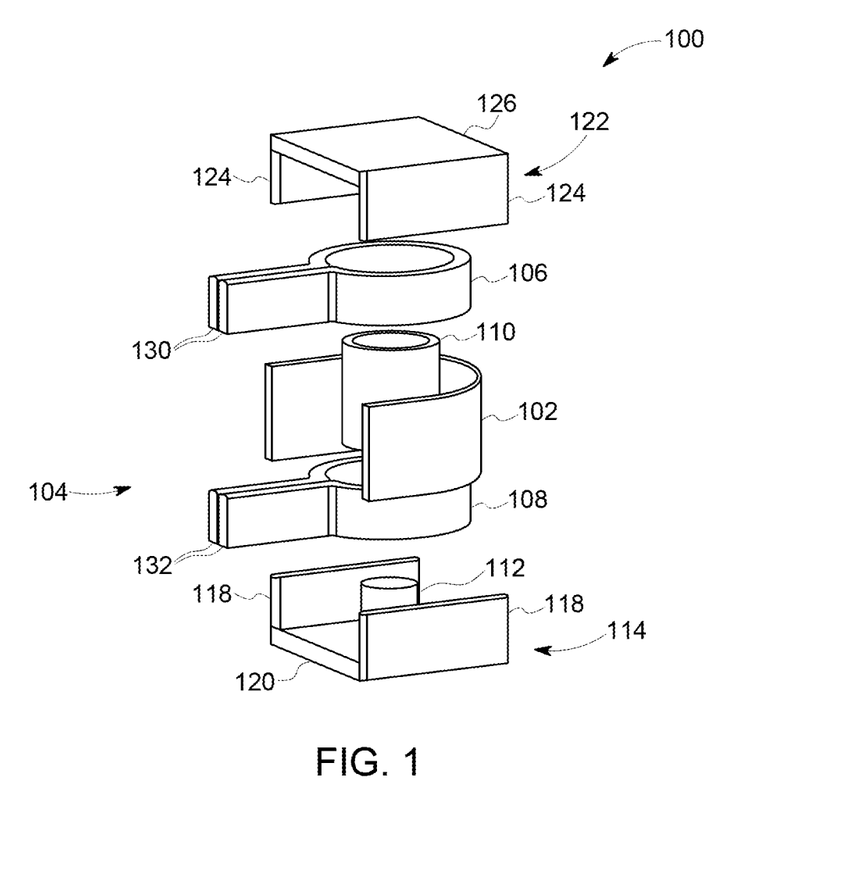
FIG. 1 is an exploded perspective view illustrating the construction of an exemplary transformer assembly including a passive heat transfer device.
Figure 2:
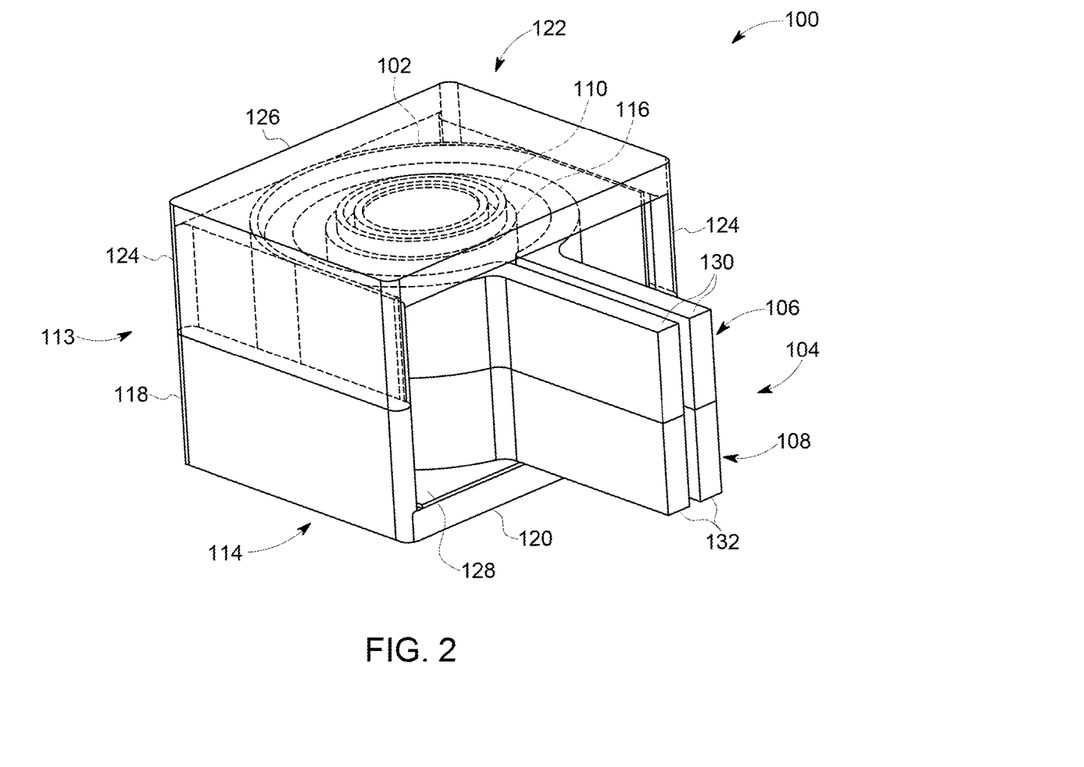
FIG. 2 is a perspective view illustrating the construction of the transformer assembly shown in FIG. 1 when assembled.

FIG. 1 is an exploded perspective view illustrating the construction of a transformer assembly 100 including a passive heat transfer device 102 (shown semi-transparently). FIG. 2 is a perspective view illustrating the construction of a transformer assembly 100 when assembled. While heat transfer device 102 is described herein with transformer assembly 100, it is noted that heat transfer device 102 can be integrated into and/or used with any electronic device that would benefit from the use of heat transfer device 102. Transformer assembly 100 is used herein merely as one example of an electronic device assembly including heat transfer device 102.

In the exemplary embodiment, transformer assembly 100 (broadly, an electronic device assembly) includes a secondary winding portion 104 (broadly, a heat producing component) defining a coil that includes an upper conductive secondary turn 106 fabricated from a conductive material, for example, and without limitation, copper or aluminum. In addition, secondary winding portion 104 includes a lower conductive secondary turn 108 that is substantially similar to upper conductive secondary turn 106, and is also fabricated from a conductive material, for example, and without limitation, copper or aluminum. While transformer assembly 100 is described as having two conductive secondary turns 106 and 108, it is noted that transformer assembly 100 may include any number of conductive secondary turns that enables transformer assembly 100 to function as described herein. In the exemplary embodiment, conductive secondary turns 106 and 108 may provide multiple turns in secondary winding portion 104 if connected in series with one another (two turns in this example), or may constitute a single turn winding if connected in parallel with one another.

In the exemplary embodiment, transformer assembly 100 also includes a primary winding 110 that defines a coil and is fabricated from a conductive material, for example, and without limitation, copper or aluminum. Primary winding 110 has an application specific number of turns of one or more wires wrapped around, for example, a center leg 112 of an E-core portion 114 of a two-piece core 113. In some embodiments, primary winding 110 is placed around any leg of two-piece core 113, for example, where two-piece core 113 is a multi-leg structure, such as in a multiphase transformer. In the exemplary embodiment, as shown in FIG. 2, primary winding 110 is wrapped around center leg 112 of E-core portion 114. In the exemplary embodiment, E-core portion 114 is constructed as an "E" shaped body of ferrite or another magnetic or ferromagnetic material, having center leg 112 and opposing side legs 118 on either side of center leg 112, each extending from a base plate 120 as shown. While center leg 112 of E-core portion 114 portion is substantially cylindrical in this embodiment, center leg 112 may have any cross-section that enables transformer assembly 100 to function as described herein, for example, and without limitation, a rectangular, a square, or another shape, as desired. In addition, while opposing side legs 118 are substantially planar and perpendicular to each other, opposing side legs 118 may have any shape that enables transformer assembly 100 to function as described herein, for example, and without limitation, each may be curved to correspond to an arc of conductive secondary turns 106 and 108. In the exemplary embodiment, two-piece core 113 is an E-type core; however, two-piece core 113 can be any type of core fabricated from any material that enables transformer assembly 100 to function as described herein.

In the exemplary embodiment, opposing side legs 118 extend to and are coupled or adhered to an upper core portion 122 (shown semi-transparently in FIG. 2). In particular, upper core portion 122 is constructed as a "U" shaped body of ferrite or another magnetic or ferromagnetic material and includes opposing side legs 124 extending from a base plate 126. Opposing side legs 124 are shaped to substantially correspond to opposing side legs 118 of E-core portion 114. As shown in FIG. 2, each side leg 124 is coupled to the terminal end of a respective side leg 118 to complete the magnetic circuit of transformer assembly 100. An insulating bobbin 116 fits over primary winding 110 and center leg 112 of E-core portion 114 and is captured between E-core portion 114 and upper core portion 122. Insulating bobbin 116 facilitates, for example, and without limitation, isolating primary winding 110 from conductive secondary turns 106 and 108 and facilitates increasing the primary-to-secondary breakdown voltage. In addition, insulating bobbin 116 facilitates controlling leakage inductance of transformer assembly 100 in repeatable fashion.

In the exemplary embodiment, insulating bobbin 116 includes a base portion 128, as shown in FIG. 2. Base portion 128 facilitates proper placement of the conductive material constituting lower conductive secondary turn 108; in this case, the outside dimension of base portion 128 should be at least slightly larger than the outside dimension of lower conductive secondary turn 108, to facilitate insulating lower conductive secondary turn 108 from electrical contact with base plate 120 of E-core portion 114. Insulating bobbin 116 may be fabricated from molded plastic or other non-conductive and non-magnetic material. An additional insulating material (not shown), such as an insulating sleeve or one or more layers of insulating tape, may be applied over the upper surfaces of upper conductive secondary turn 106 and primary winding 110 and/or to the inner surface of base plate 126 of upper core portion 122 as necessary or desirable for insulating upper conductive secondary turn 106 and primary winding 110 from electrical contact with base plate 126 of upper core portion 122.

Alternatively, transformer assembly 100 may be constructed as a "bobbin-less" transformer assembly. A bobbin-less construction generally relies on an insulating material applied to wires wrapped around a mold, followed by curing or other solidification of the insulating material and removal from the mold. The solidified insulating material is of sufficient strength and thickness to maintain the shape and integrity of primary winding 110.

In the exemplary embodiment, heat transfer device 102 is a passive, flexible, dielectric two-phase heat transfer device (e.g., pulsating heat pipe) that is coupled in thermal communication with conductive secondary turns 106 and 108. Heat transfer device 102 extends at least partially around conductive secondary turns 106 and 108. In particular, heat transfer device 102 extends about 180 degrees around conductive secondary turns 106 and 108 opposite a plurality of leads 130 and 132 of conductive secondary turns 106 and 108, respectively.

Figure 3:
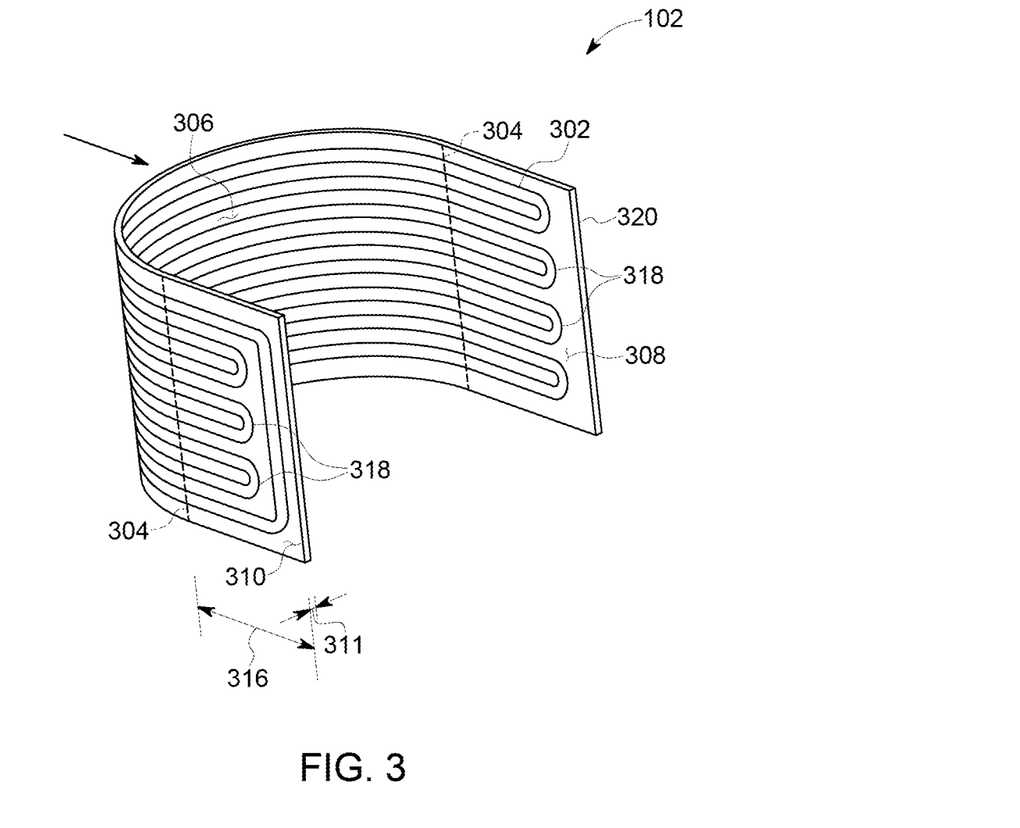
FIG. 3 is a perspective view of a first configuration of the passive heat transfer device shown in FIG. 1.
Figure 4:
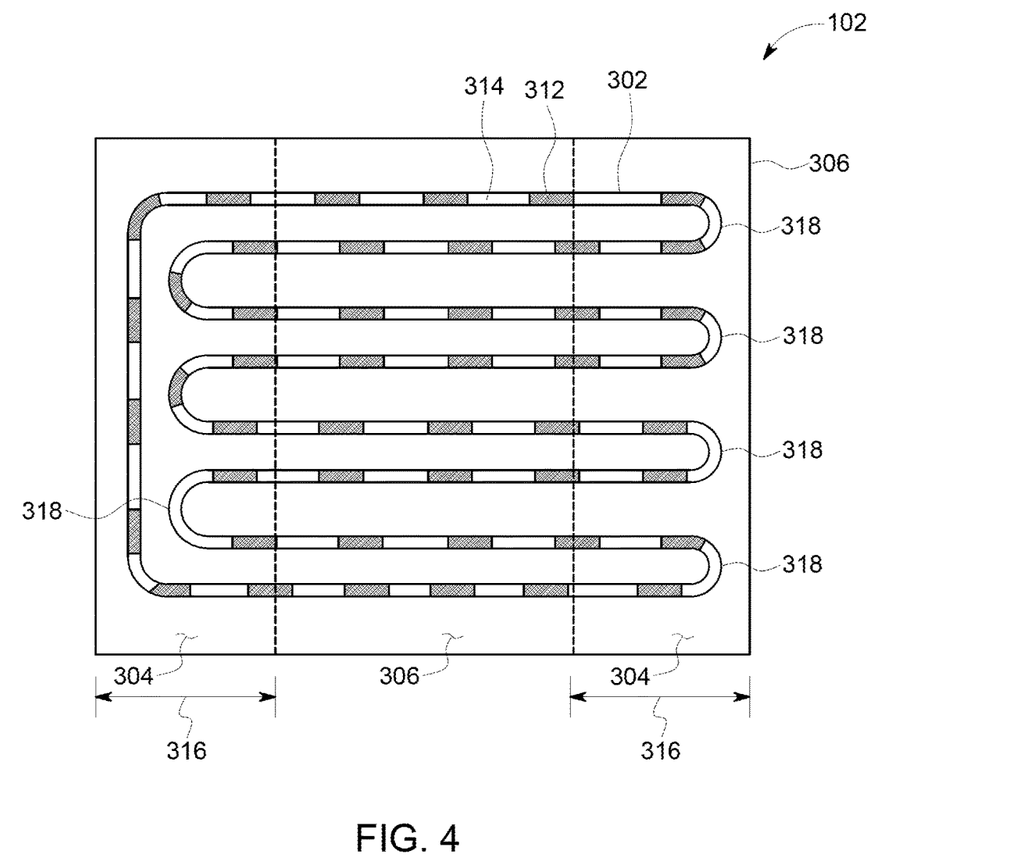
FIG. 4 is a second configuration of the heat transfer device shown in FIG. 3, shown in a substantially planar configuration.

FIG. 3 is a perspective view of a first configuration of heat transfer device 102 for use in transformer assembly 100 (shown in FIG. 1), and FIG. 4 is a second configuration of heat transfer device 102 shown in a substantially planar configuration. In the exemplary embodiment, for use in transformer assembly 100, heat transfer device 102 is configured as a "U" shaped dielectric component, in the sense that it includes two legs 316 extending from a central curved portion, where each leg 316 is coupled in thermal communication to the legs of two-piece core 113 (shown in FIG. 2), as will be evident from the following description. Heat transfer device 102 is configured to provide adequate cooling of transformer assembly 100. Heat transfer device 102 includes, for example, any type of pulsating heat pipe system. For example, in the exemplary embodiment, heat transfer device 102 includes a plurality of internal thermal channels 302, at least one condenser portion or region 304, and at least one evaporator portion or region 306.

In the exemplary embodiment, each of legs 316 are substantially the same length and are configured to couple in thermal communication to at least a portion of side legs 118 of E-core portion 114 and opposing side legs 124 of upper core portion 122. In particular, one leg 316 of heat transfer device 102 is configured to be in direct thermal contact with a portion of a side leg 118/opposing side leg 124 pair of two-piece core 113 (i.e., upper core portion 122 and E-core portion 114), and the other leg 316 is configured to be in direct thermal contact with a portion of the other side leg 118/opposing side leg 124 pair of two-piece core 113. In this manner, two-piece core 113 functions as a heat dissipation member. This facilitates coupling condenser region 304 with E-core portion 114 and upper core portion 122 to facilitate removing heat from heat transfer device 102. In alternative embodiments, legs 316 have any length that enables heat transfer device 102 to function as described herein. For example, and without limitation, in some embodiments, one or more of legs 316 are coupled in thermal communication to an external heat dissipation member, such as, for example, a heat sink or cold plate, to facilitate transferring heat away from transformer assembly 100.

In the exemplary embodiment, heat transfer device 102 is fabricated from a dielectric material 320, i.e., an electrical insulation material, for example, and without limitation, mica, plastics, glass, porcelain, and various metal oxides. In one particular embodiment, heat transfer device 102 is fabricated from polyetheretherketone ("PEEK"), a semicrystalline thermoplastic with mechanical and chemical resistance properties that are retained to high temperatures and a low electrical conductivity. In alternative embodiments, material 320 can be any material that enables transformer assembly 100 to function as described herein. Fabricating flexible heat transfer device 102 from a dielectric material facilitates wrapping heat transfer device 102 around electromagnetic components without affecting the efficiency of the electromagnetic components, for example, due to eddy currents generated in the heat transfer device 102.

In the exemplary embodiment, heat transfer device 102 is fabricated using an additive manufacturing process (e.g., 3D-printing), such as, for example, a fused-deposition process or a reinforced filament fusion process. Fused-deposition includes feeding a material filament, such as PEEK filament, into a heated extrusion head of an additive manufacturing machine. The heated extrusion head melts and deposits the molten material onto a build platform to form the component layer by layer. In the exemplary embodiment, heat transfer device 102 has a first face 308 and an opposite second face 310. In one embodiment, heat transfer device 102 is a sheet-like structure that has a substantially similar thickness 311, such that first face 308 is spaced from opposite second face 310 a constant distance. Alternatively, heat transfer device 102 has any thickness, including a varying thickness, that enables transformer assembly 100 to function as described herein. In the exemplary embodiment, thickness 311 of heat transfer device 102 is selected to provide desired heat transfer properties for transformer assembly 100, while rendering heat transfer device 102 flexible. For example, thickness 311 of heat transfer device 102 is selected such that heat transfer device 102 can be flexed or bent, for example, between the first configuration shown in FIG. 3 and the second configuration shown in FIG. 4.

In the exemplary embodiment, thermal channels 302 are embedded within heat transfer device 102. Notably, rather than utilizing a plurality of separate thermal channels 302, heat transfer device 102 utilizes only one thermal channel 302 or single network of interconnected channels, such as the separate serpentine, closed system pattern shown in FIG. 4. Alternatively, each thermal channel 302 may be a single, unitary conductive passage or a plurality of separate conductive passages that are coupled together. In the exemplary embodiment, the shape and length of thermal channels 302 is selected to provide desired heat transfer properties and accommodate the available space in heat transfer device 102. In alternative embodiments, thermal channels 302 may be arranged in an open loop system. Open loop, or an open system, includes thermal channels 302 that do not connect with themselves.

Thermal channels 302 may include any quantity of individual thermal channels 302 ranging from a single thermal channel 302 to a near infinite quantity of separate thermal channels 302. In certain embodiments with multiple thermal channels 302, all thermal channels 302 may be closed, opened, or any combination of opened and closed. The geometry of each thermal channel 302 may also vary from a straight thermal channel 302 extending from evaporator region 306 to one or more of condenser regions 304; to thermal channel 302 with a plurality of turns, such as turns 318, defined therein. In the exemplary embodiment, thermal channels 302 are arranged in a serpentine and substantially horizontal pattern (See e.g., FIG. 4). Alternatively, thermal channels 302 are arranged in a non-repeating, asymmetric, and/or non-planar arrangement while still providing sufficient cooling of transformer assembly 100. An advantage of the thermal channel arrangements described herein is that the geometry and arrangement of thermal channels 302 may be entirely independent of gravity and orientation. That is, the orientation of heat transfer device 102 and gravity does not substantially affect the flow and the cooling performance of a working fluid and vapor in heat transfer device 102. In some embodiments, for example, thermal channels 302 may be substantially horizontal, substantially vertical, or any combinations thereof. As such, flexible heat transfer device 102 allows for increased flexibility of the manufacturing size and arrangement of transformer assembly 100.

In the exemplary embodiment, heat transfer device 102, and in particular, thermal channels 302, is a sealed, two-phase, capillary heat pipe that is flexible (i.e., bendable) and contains a working fluid 312, for example, and without limitation, water, ethanol, butane, ammonia, and the like, with a boiling point less than or equal to approximately 200 degrees Celsius. In order for thermal channels 302 of heat transfer device 102 to function as a pulsating heat pipe, less than the entirety, i.e., less than 100%, of the thermal channels 302 volume is filled with working fluid 312. For example, and without limitation, in certain embodiments a ratio of working fluid 312 to the total volume of thermal channels 302 is in a range between about 10% to about 90%. In the exemplary embodiment, while a portion of thermal channels 302 is filled with working fluid 312, the remaining portion contains air or vapor bubbles 314. This facilitates increasing the thermal conductivity of heat transfer device 102. For example, by utilizing the phase changes of the working fluid 312, i.e., the evaporation of working fluid 312 in evaporator region 306 and the subsequent condensing of vapor bubbles 314 in condenser region 304, heat transfer device 102 is able to significantly increase the effectiveness of the thermal conductivity of material 320. In addition, because heat transfer device 102 contains no moving parts and the working fluid 312/vapor bubbles 314 are moved by thermal expansion of vapor bubbles 314, the reliability of heat transfer device 102 is increased as compared to traditional heat transfer devices.

In operation, each of conductive secondary turns 106 and 108 have a relatively high electrical current flowing therethrough via leads 130 and 132, respectively. In addition, primary winding 110 has a relatively high electrical current flowing therethrough. The current facilitates increasing a temperature of primary winding 110 and conductive secondary turns 106 and 108 such that each becomes relatively hot, defining a hot region generally opposite the leads 130 and 132 of conductive secondary turns 106 and 108, respectively. The high temperatures of primary winding 110 and conductive secondary turns 106 and 108 can reduce the efficiency and reliability of transformer assembly 100. In the exemplary embodiment, heat transfer device 102 is coupled to transformer assembly 100 proximate an outer surface of conductive secondary turns 106 and 108. In alternative embodiments, heat transfer device 102 is coupled to transformer assembly 100 proximate an outer surface of primary winding 110. In the exemplary embodiment, the heat from each of conductive secondary turns 106 and 108 is conductively transferred to evaporator region 306 of heat transfer device 102. The heat is then conductively transferred to thermal channels 302. In contrast, heat in portions of thermal channels 302 of evaporator region 306 is conductively transferred to portions of thermal channels 302 in condenser regions 304 of heat transfer device 102. Because condenser regions 304 are thermally coupled to E-core portion 114 and upper core portion 122 of transformer assembly 100, which are cooled, for example, by a cold plate, a heat sink, and/or by the ambient air surrounding transformer assembly 100, E-core portion 114 and upper core portion 122 therefore conductively cool condenser regions 304. In this manner, legs 316 of heat transfer device 102 are cooled by the ambient air surrounding transformer assembly 100. More specifically, for each thermal channel 302, the portion enclosed in condenser regions 304 is maintained at a cooler temperature than the portion of thermal channel 302 contained in evaporator region 306 during operation of transformer assembly 100.

Working fluid 312 is distributed over the circuit length of thermal channels 302 into distinct liquid portions, i.e., working fluid 312, and vapor bubbles 314. As such, various portions of thermal channels 302 in heat transfer device 102 (i.e., the pulsating heat pipe) have different volumetric liquid/vapor distributions. During operation of transformer assembly 100, each thermal channel 302 section located in evaporator region 306 is heated by virtue of its proximity to conductive secondary turns 106 and 108. Similarly, each thermal channel 302 section located in one of condenser regions 304 is cooled. As a result of heating by conductive secondary turns 106 and 108, vapor bubbles 314 are generated and/or increase in size in evaporator region 306 and collapse and/or decrease in size in each of condenser regions 304. The changes in size of vapor bubbles 314 facilitates moving working fluid 312 through thermal channels 302 due to the bubble pumping action, resulting in heat transfer within heat transfer device 102. This heat transfer cycle continuously repeats itself during the operation of transformer assembly 100 such that thermal channels 302 function to actively cool conductive secondary turns 106 and 108.

Figure 5:
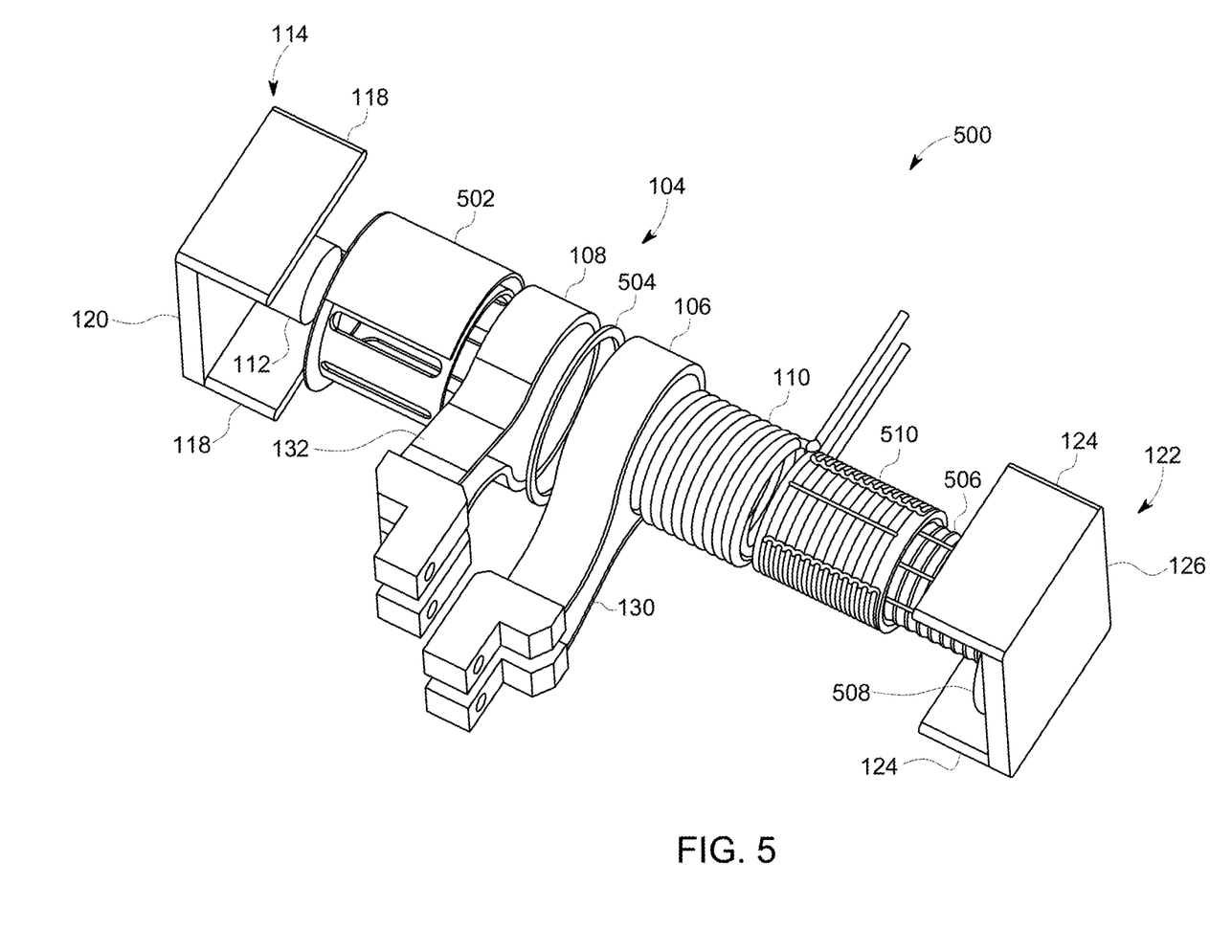
FIG. 5 is an exploded perspective view illustrating the construction of an alternative exemplary transformer assembly including a heat transfer bobbin.
Figure 6:
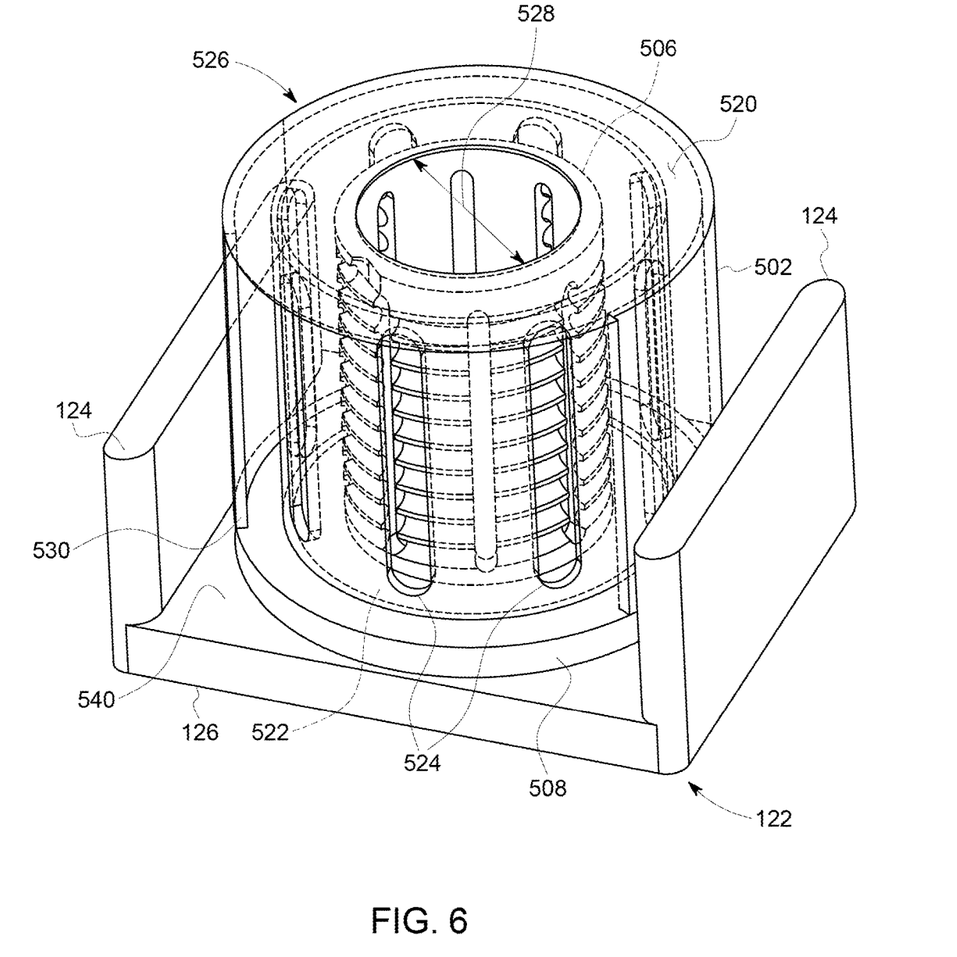
FIG. 6 is a perspective view illustrating an upper core portion of the transformer assembly shown in FIG. 5, including a plurality of bobbins and the heat transfer bobbin shown in FIG. 5.

FIG. 5 is an exploded perspective view illustrating the construction of an alternative transformer assembly 500 (broadly, an electronic device assembly) including a heat transfer bobbin 502 (shown semi-transparently). FIG. 6 is a perspective view illustrating upper core portion 122 with a plurality of bobbins, including heat transfer bobbin 502 (shown semi-transparently). In the exemplary embodiment, transformer assembly 500 is constructed in a similar fashion as transformer assembly 100 described above. Similar components in transformer assembly 500 as in transformer assembly 100 described above are referred to by way of the same reference numerals, and will be constructed similarly as previously described.

As described above in connection with transformer assembly 100, secondary winding portion 104 (broadly, a heat producing component) of transformer assembly 500 includes upper conductive secondary turn 106 and lower conductive secondary turn 108 that is substantially similar to upper conductive secondary turn 106. While transformer assembly 500 is described as having two conductive secondary turns 106 and 108, it is noted that transformer assembly 500 may include any number of conductive secondary turns that enables transformer assembly 500 to function as described herein. In the exemplary embodiment, conductive secondary turns 106 and 108 may provide multiple turns in secondary winding portion 104 if connected in series with one another (two turns in this example), or may constitute a single turn winding if connected in parallel with one another. In the exemplary embodiment, a spacer 504 is located between the adjacent edges of conductive secondary turns 106 and 108. Spacer 504 is used to facilitate maintaining a gap between conductive secondary turns 106 and 108 such that they are electrically isolated from each other.

Furthermore, primary winding 110 is constructed having one or more wires wrapped around center leg 112 of E-core portion 114. In particular, in this embodiment, transformer assembly 500 includes an insulative sleeve 506 that is configured to slide over center leg 112 and receive at least a portion of primary winding 110 wrapped therearound. Insulative sleeve 506 includes a base flange 508 that facilitates proper placement of the conductive material constituting upper conductive secondary turn 106. The outside dimension of base flange 508 is at least slightly larger than the outside dimension of upper conductive secondary turn 106, to facilitate insulating upper conductive secondary turn 106 from electrical contact with base plate 126 of upper core portion 122. Insulative sleeve 506 may be fabricated from molded plastic or other non-conductive and non-magnetic material. In the exemplary embodiment, primary winding 110 includes two layers of wire, and as such, transformer assembly 500 includes an additional insulating member 510 that is applied over the outer surface of the first layer of primary winding 110 as necessary or desirable for insulating the layers of primary winding 110 from each other.

In the exemplary embodiment, heat transfer bobbin 502 fits over and supports concentric primary winding 110 and conductive secondary turns 106 and 108, and is captured between E-core portion 114 and upper core portion 122. Heat transfer bobbin 502 facilitates isolating primary winding 110 from conductive secondary turns 106 and 108 and facilitates increasing the primary-to-secondary breakdown voltage.

Figure 7:
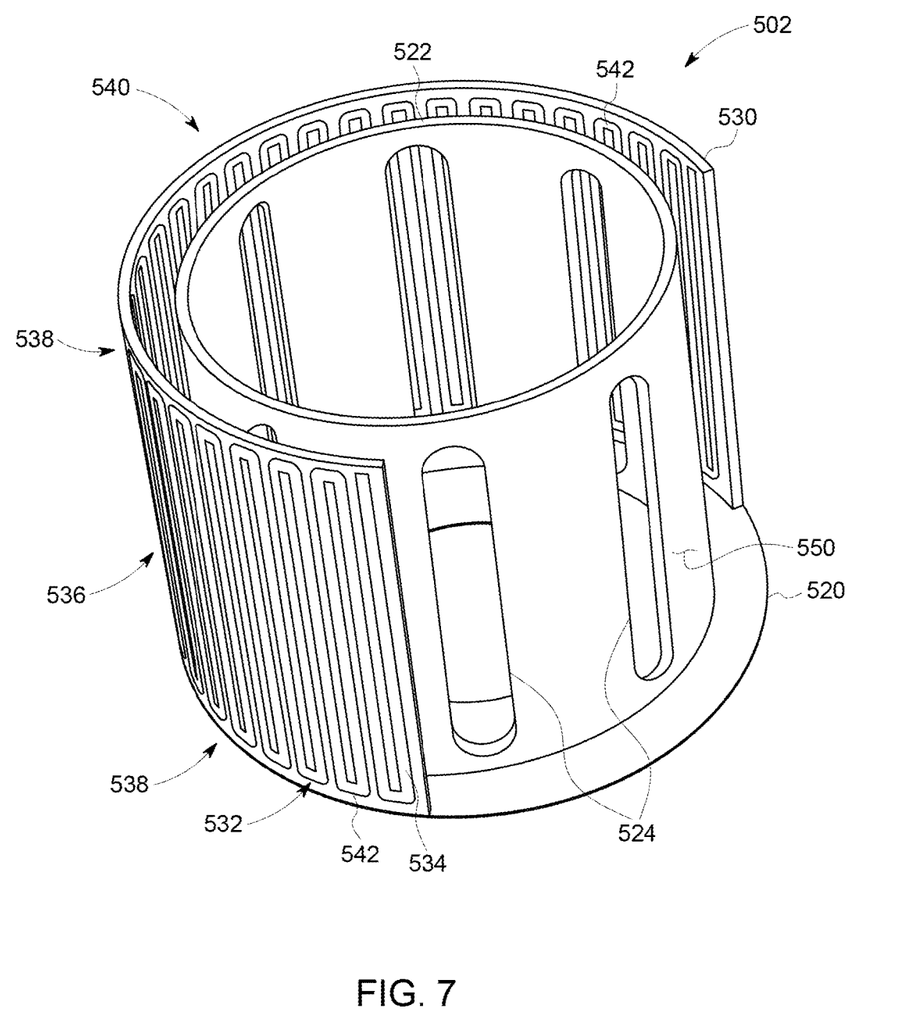
FIG. 7 is a perspective view of heat transfer bobbin shown in FIG. 5.

FIG. 7 is a perspective view of heat transfer bobbin 502 for use with transformer assembly 500 (shown in FIG. 5). In the exemplary embodiment, heat transfer bobbin 502 includes a base portion 520 that facilitates proper placement of the conductive material constituting lower conductive secondary turn 108; in this case, the outside dimension 526 of base portion 520 is at least slightly larger than the outside dimension of lower conductive secondary turn 108, to facilitate insulating lower conductive secondary turn 108 from electrical contact with base plate 120 of E-core portion 114. Base portion 520 also includes an inner diameter 528 that is sized substantially similar to a diameter of center leg 112 of E-core portion 114. As such, heat transfer bobbin 502 can slide over center leg 112 to facilitate extending center leg 112 into the center of primary winding 110 and secondary turns 106 and 108.

Heat transfer bobbin 502 includes a cylindrical wall 522 extending from the base portion 520. In the exemplary embodiment, cylindrical wall 522 includes a plurality of longitudinal slots 524 defined therein. The plurality of longitudinal slots 524 are substantially equally spaced around cylindrical wall 522 and are configured to enable a potting compound to flow therethrough during assembly of transformer assembly 500. A potting compound facilitates improving dielectric strength and isolation between the windings of transformer assembly 500, and providing for better thermal conductivity, structural integrity, and resistance to environmental conditions. In an alternative embodiment, longitudinal slots 524 facilitate airflow therethrough for helping to cool primary winding 110. In the exemplary embodiment, cylindrical wall 522 is sized and shaped to fit around primary winding 110, enclosing it therein, while fitting within conductive secondary turns 106 and 108. As such, cylindrical wall 522 provides an insulating barrier between primary winding 110 and conductive secondary turns 106 and 108 to facilitate maintaining electrical isolation.

Furthermore, heat transfer bobbin 502 includes a heat transfer wall 530 extending from the perimeter of base portion 520. In the exemplary embodiment, heat transfer wall 530 includes a gap configured to allow leads 130 and 132 of conductive secondary turns 106 and 108, respectively, to extend therethrough. As such, heat transfer wall 530 substantially surrounds the curved portions of conductive secondary turns 106 and 108.

In the exemplary embodiment, heat transfer wall 530 includes a heat transfer circuit 532 defined therein. Heat transfer circuit 532 is a two-phase heat transfer circuit (e.g., pulsating heat pipe) that is coupled in thermal communication with conductive secondary turns 106 and 108 and is configured to provide adequate cooling of transformer assembly 500. Heat transfer circuit 532 includes, for example, any type of pulsating heat pipe system. For example, in the exemplary embodiment, heat transfer circuit 532 includes a plurality of internal thermal channels 534, at least one evaporator portion or region 536, and at least one condenser portion or region 538. In the exemplary embodiment, the ends of internal thermal channels 534, for example, turns 542, proximate base portion 520 functions as a condenser portion or region 538. In addition, an end portion 540 of heat transfer bobbin 502 opposite base portion 520 may also function as a condenser portion or region 538. For example, as shown in FIG. 6, end portion 540 is in direct contact with base flange 508 of insulative sleeve 506 and facilitates transferring heat from evaporator region 536 to upper core portion 122.

In the exemplary embodiment, heat transfer bobbin 502 is fabricated from an electrical insulation material 550, such as a dielectric material, for example, and without limitation, mica, plastics, glass, porcelain, and various metal oxides. In one particular embodiment, heat transfer bobbin 502 is fabricated from polyetheretherketone ("PEEK"), a semicrystalline thermoplastic with excellent mechanical and chemical resistance properties that are retained to high temperatures and a low electrical conductivity. In alternative embodiments, material 550 can be any material that enables transformer assembly 500 to function as described herein. In the exemplary embodiment, heat transfer bobbin 502 is fabricated using an additive manufacturing process (e.g., 3D-printing), such as, for example, a fused-deposition process or a reinforced filament fusion process.

In the exemplary embodiment, heat transfer wall 530 has a substantially similar thickness that is selected to provide desired heat transfer properties for transformer assembly 500. Thermal channels 534 are embedded within heat transfer bobbin 502, and in particular heat transfer wall 530. Notably, rather than utilizing a plurality of separate thermal channels 534, heat transfer wall 530 utilizes only one thermal channel 534 or single network of interconnected channels, such as the separate serpentine, closed system pattern shown in FIG. 7. Alternatively, each thermal channel 534 may be a single, unitary conductive passage or a plurality of separate conductive passages that are coupled together. In the exemplary embodiment, the shape and length of thermal channels 534 is selected to provide desired heat transfer properties and accommodate the available space in heat transfer wall 530. In alternative embodiments, thermal channels 534 may be arranged in an open loop system. Open loop, or an open system, includes thermal channels 534 that do not connect with themselves.

Thermal channels 534 may include any quantity of individual thermal channels 534 ranging from a single thermal channel 534 to a near infinite quantity of separate thermal channels 534. In certain embodiments with multiple thermal channels 534, all thermal channels 534 may be closed, opened, or any combination of opened and closed. The geometry of each thermal channel 534 may also vary from a straight thermal channel 534 extending from base portion 520 to base portion 520; to thermal channel 534 with a plurality of turns, such as turns 542, defined therein. In the exemplary embodiment, thermal channels 534 are arranged in a serpentine and substantially vertical pattern (See e.g., FIG. 7). Alternatively, thermal channels 534 are arranged in a non-repeating, asymmetric, and/or non-linear arrangement while still providing sufficient cooling of transformer assembly 500. An advantage of the thermal channel arrangements described herein is that the geometry and arrangement of thermal channels 534 may be entirely independent of gravity and orientation. That is, the orientation of heat transfer wall 530 and gravity does not substantially affect the flow and the cooling performance of a working fluid and vapor in heat transfer wall 530. In some embodiments, for example, thermal channels 534 may be substantially horizontal, substantially vertical, or any combinations thereof. As such, flexible heat transfer wall 530 allows for increased flexibility of the manufacturing size and arrangement of transformer assembly 500.

In the exemplary embodiment, heat transfer wall 530, and in particular, heat transfer circuit 532, facilitates forming a heat transfer bobbin 502 with an integral sealed, two-phase, capillary heat pipe and contains a working fluid, such as working fluid 312 described above. In the exemplary embodiment, heat transfer circuit 532 functions substantially similar to heat transfer device 102. As such, heat transfer circuit 532 facilitates increasing the thermal conductivity of heat transfer bobbin 502. For example, by utilizing the phase changes of the working fluid 312, i.e., the evaporation of working fluid 312 in evaporator region 536 and the subsequent condensing of vapor bubbles 314 at base portion 520 and end portion 540, heat transfer circuit 532 is able to significantly increase the effectiveness of the thermal conductivity of material 550. In addition, because heat transfer bobbin 502 contains no moving parts and the working fluid 312/vapor bubbles 314 are moved by thermal expansion of vapor bubbles 314, the reliability of heat transfer bobbin 502 is increased as compared to traditional heat transfer devices.

The embodiments described herein relate to apparatuses and methods for facilitating cooling of transformer assemblies. In particular, a flexible, dielectric heat pipe is coupled to a transformer assembly. The flexibility of the heat pipe allows for the heat pipe to be placed proximate to the curved windings of the transformer to facilitate transferring heat away from the windings. In addition, condenser regions, such as end portions, of the heat pipe can be routed and coupled in thermal communication to a heat dissipation member, such as a heat sink or cold plate, for dissipating the heat. Another embodiment described herein discloses a bobbin structure for a transformer assembly that includes an integrally formed heat pipe system. The heat pipe systems contain no moving parts and facilitate improving the efficiency and reliability of the transformer assembly.

Exemplary embodiments of methods and apparatuses are not limited to the specific embodiments described herein, but rather, components of apparatuses and steps of the methods may be utilized independently and separately from other components and steps described herein. For example, the methods may also be used to cool other components, and are not limited to practice with only the components and methods as described herein. Rather, the exemplary embodiment can be implemented and utilized in connection with many other applications, equipment, and systems that may benefit from the advantages described herein.

Although specific features of various embodiments of the disclosure may be shown in some drawings and not in others, this is for convenience only. In accordance with the principles of the disclosure, any feature of a drawing may be referenced and claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An electronic device assembly comprising:
a heat dissipation member; and
a dielectric two-phase heat transfer device comprising:
an evaporator region coupled in thermal communication with a hot region of a heat producing component; and
a condenser region coupled in thermal communication with said heat dissipation member, said dielectric two-phase heat transfer device fabricated from a dielectric material,
wherein the heat producing component comprises a secondary winding portion of a transformer assembly, the secondary winding portion further comprising:
an upper conductive secondary turn; and
a lower conductive secondary turn,
wherein the dielectric two-phase heat transfer device extends about 180 degrees around the upper conductive secondary turn and the lower conductive secondary turn opposite a plurality of leads.

2. The electronic device assembly in accordance with claim 1, wherein said dielectric two-phase heat transfer device further comprises at least one thermal channel that extends from said evaporator region to said condenser region,
wherein the at least one thermal channel is arranged in a non-repeating, asymmetric, and/or non-planar arrangement.

3. The electronic device assembly in accordance with claim 2 further comprising a working fluid in said thermal channel, and
wherein said dielectric material comprises one or more of mica, plastics, glass, porcelain, metal oxides, and polyetheretherketone.

4. The electronic device assembly in accordance with claim 3, wherein said working fluid fills less than an entire volume of said thermal channel and, wherein said thermal channel includes at least one of air and vapor bubbles separating portions of said working fluid,
wherein said working fluid fills between 10% and 90% of the entire volume of said thermal channel.

5. The electronic device assembly in accordance with claim 3, wherein said working fluid has a boiling point less than or equal to approximately 200 degrees Celsius, and
wherein said dielectric material comprises a fused-deposition material.

6. The electronic device assembly in accordance with claim 3, wherein said working fluid comprises at least one of water, ethanol, butane, and ammonia,
wherein ambient air surrounding the electronic device acts as a heat sink to the heat dissipation member.

7. The electronic device assembly in accordance with claim further comprising:
a primary winding wrapped around a center leg of a core portion, the core portion constructed of at least one of a ferrite and a ferromagnetic material, the core portion further comprising at least two opposing side legs, the at least two opposing side legs being disposed on either side of the center leg each leg of the two opposing side legs extending from a base plate,
wherein said heat dissipation member comprises a core of said heat producing component.

8. The electronic device assembly in accordance with claim 1, wherein said dielectric two-phase heat transfer device is formed as a sheet-like structure having a thickness that renders said dielectric two-phase heat transfer device flexible, wherein said dielectric two-phase heat transfer device further comprises a u-shaped dielectric component, the u-shaped dielectric component comprises two legs extending from a central curved portion, wherein each leg of the two legs is thermally coupled to the legs of a two-piece transformer core, and wherein the dielectric two-phase heat transfer device is passively driven.

9. A method of cooling an electronic device assembly including a heat producing component having a hot region, said method comprising:

forming a flexible dielectric two-phase heat transfer device from a dielectric material, the flexible dielectric two-phase heat transfer device including an evaporator region and a condenser region;

thermally coupling the evaporator region to the hot region of the heat producing component; and thermally coupling the condenser region to a heat dissipation member, wherein said dielectric two-phase heat transfer device further comprises a u-shaped dielectric component, the u-shaped dielectric component comprises two legs extending from a central curved portion, wherein each leg of the two legs is thermally coupled to a leg of a two-piece transformer core, wherein the thermal channel comprises a plurality of thermal channels, and wherein each thermal channel of the plurality of thermal channels comprises a plurality of separate conductive passages that are coupled together.

10. The method in accordance with claim 9, wherein forming a flexible dielectric two-phase heat transfer device comprises forming a thermal channel within the flexible dielectric two-phase heat transfer device, the thermal channel extending from the evaporator region to the condenser region.

11. The method in accordance with claim 10, the method further comprising adding a working fluid to the thermal channel, wherein the working fluid fills less than an entire volume of the thermal channel, such that the thermal channel includes at least one of air and vapor bubbles separating portion of the working fluid, and wherein ambient air surrounding the electronic device acts as a heat sink to the heat dissipation member.

12. The method in accordance with claim 9, wherein thermally coupling the evaporator region to the hot region of the heat producing component comprises bending the flexible dielectric two-phase heat transfer device around at least a portion of the heat producing component, and wherein the flexible dielectric two-phase heat transfer device is passively driven.

* * * * *